United States Patent [19]

Kurtz et al.

[11] 4,434,347
[45] Feb. 28, 1984

[54] LEAD FRAME WIRE BONDING BY PREHEATING

[75] Inventors: John A. Kurtz, Gorham; Donald E. Cousens, Saco, both of Me.

[73] Assignee: Fairchild Camera and Instrument Corporation, Mountain View, Calif.

[21] Appl. No.: 294,411

[22] Filed: Aug. 19, 1981

[51] Int. Cl.³ .............................................. B23K 11/32
[52] U.S. Cl. ............................... 219/56.22; 219/56.21; 219/85 F; 228/179
[58] Field of Search ................ 219/56.1, 56.21, 56.22, 219/85 F, 85 M, 85 R, 85 CA, 85 CM, 137 R; 228/179, 180 A

[56] References Cited

U.S. PATENT DOCUMENTS 3,409,977 11/1968 Johnson ............................ 219/56.22
4,323,759 4/1982 Edson et al. ..................... 219/56.22

OTHER PUBLICATIONS

W. A. Owczarski, "Resistance Autobrazing of Wires to Intermetallic Thermoelectric Materials", *Welding Journal*, 5/1961, pp. 517-521.

Primary Examiner—C. C. Shaw
Attorney, Agent, or Firm—Kenneth Olsen; Daniel H. Kane, Jr.; Carl L. Silverman

[57] ABSTRACT

In a method for welding a lead wire or bonding wire from a microcircuit chip mounted on a lead frame to a lead frame finger, the lead frame finger is preheated prior to any substantial electrical or thermal coupling between the lead frame finger and chip. Intense but controlled energy is applied to the lead frame finger at levels which might otherwise damage the IC chip. In one embodiment the lead frame finger is preheated to a temperature below the melting point of the metal comprising the lead frame. Enhanced bonding is thereafter effected by thermocompression bonding etc. In another embodiment the preheating step comprises melting a portion of the surface of the lead frame finger, forming a molten pool or puddle in the surface. Bonding of the lead wire is effected by immersing a section of the wire in the molten pool or puddle. In order to preheat the lead frame finger a controlled pulse train is delivered for arc discharge at the bonding location. Bonding apparatus and circuitry for preforming the method are described.

38 Claims, 18 Drawing Figures

FIG IA (PRIOR ART)

Timing Diagram

LEAD FRAME WIRE BONDING BY PREHEATING

TECHNICAL FIELD

This invention relates to a new method and apparatus for welding or bonding a lead wire or bonding wire from an integrated circuit chip mounted on a lead frame to a lead frame finger or prong. The invention permits wire bonding to lead frames of common metals such as copper alloy, red brass and stainless steel without the need for gold or silver plating of the lead frame elements. Furthermore, lead wires of copper and other common metals may be used instead of gold and silver bonding wire.

BACKGROUND ART

Integrated circuit or microcircuit chips are generally mounted on lead frames for coupling to external circuitry. Such lead frames are stamped in long strips or lengths of metal ribbon. A fragmentary portion of such a lead frame strip 6 showing two successive lead frames 5 is illustrated in FIG. 1. Each lead frame 5 includes a paddle 7 to which the microcircuit chip is secured by epoxy resin, and a plurality of lead frame fingers or prongs 8 which extend from a "dam" 9 toward the paddle to receive the lead wires from the chip. After lead frames have been stamped in long lengths of metal ribbon, the ribbon is mounted on large reels for shipping to the customer.

The lead frames are generally stamped from copper alloy, red brass, stainless steel, and similar metals. According to the conventional methods of lead wire bonding, the paddle and lead frame fingers must be plated with gold or silver in order to achieve good quality welds. In order to prepare the lead frames, the reels of stamped ribbon are shipped to another location for plating and stamping or cutting into shorter strips. The lead frames are thereafter shipped again to the microcircuit chip manufacturer for packaging the chips. Because of the extensive shipping and handling required the lead frame ribbons are frequently bent or damaged particularly during the shipping and handling of the large reels.

Bonding of lead wires between a microcircuit chip and the lead frame on which the chip is mounted is generally accomplished by "ball/wedge" bonding. According to this technique a lead wire or bonding wire 11 is held in a capillary tool 12 with the lead wire 11 projecting beyond the end of the tool as shown in FIG. 1A. The capillary tool 12 forms part of a bonding machine in which the tool is appropriately mounted and positioned over the metallized die pad 14 of an integrated circuit chip or substrate 17, mounted on paddle 7. As shown in FIG. 1A a ball 15 of metal has been formed at the end of the lead wire or bonding wire 11 by melting for example with a hydrogen gas flame torch or by electric arc discharge.

After rehardening of the metal ball 15 of the ball end of the wire is brought into intimate contact with the metallized die pad 14 as shown in FIG. 1A. A bond is formed typically by thermocompression bonding applying a specified force and temperature for a specified period of time. Metallic welding and diffusion combine to form this basic bond. Alternatively, ultrasonic bonding or other form of welding may be used.

The capillary tool 12 and substrate 17 are then moved relative to each other for bonding of the wire to lead frame finger 8. At this location a wedge bond between the lead wire 11 and finger 8 is generally formed and the lead wire or bonding wire 11 is severed below the bonding tool at the weld. The wedge bond is formed by thermocompression or ultrasonic bonding with the edge of the capillary tool bearing against the wire and lead frame finger. In this manner a lead wire connection is established between the metallized substrate of a chip and the lead frame for coupling to external circuitry. Further background on bonding of lead wires can be found in the article "Evaluating Wire Bond Quality" by Steven W. Hinch and Donald R. Cropper in the February 1981 issue of *Semiconductor International,* and in copending U.S. patent application Ser. No. 262,595 filed May 11, 1981 entitled "Bonding Wire Ball Forming Method and Apparatus", assigned to the common assignee of the present invention and now U.S. Pat. No. 4,390,771.

The conventional approach to securing lead wire or bonding wire between the microcircuit chip and lead frame fingers is limited to methods in which the chip and lead frame finger are maintained at the same relatively low level temperature, a temperature below the level at which damage might occur to the chip. Thus, thermocompression and ultrasonic welding or bonding methods are used at temperatures typically no greater than for example 200° C. The ball bond must be formed first because it requires the use of the free end of the wire. Since this is the preferred bond at the chip, the ball bond to the chip is formed first. The capillary tool then bears against the lead frame finger to effect the second bond. In the conventional approach the lead frame finger is therefore electrically and thermally coupled to the chip during the second bond. Heating of the second bond by application of electrical energy is therefore severely limited because of the damage which might occur at the chip due to excessive voltage, current or temperature.

At these lower bonding energies, gold or silver plating of the bonding surfaces, i.e. the lead frame fingers, is necessary in order to achieve secure welds with good electrical contact. Furthermore, gold or silver lead wire and bonding wire is also generally used for the same reasons.

Copending U.S. patent application Ser. No. 262,595 referred to above describes a new method and apparatus for ball bonding to the microcircuit chip using lead wires of copper, aluminum and other reactive metals in addition to gold and silver. The present invention carries this approach further to achieve high quality welds at the lead frame fingers for lead wires of copper etc. and furthermore without the need for gold or silver plating of the lead frame fingers.

OBJECTS OF THE INVENTION

It is therefore an object of the present invention to provide a new method and apparatus for welding or bonding a lead wire or bonding wire from a microcircuit chip to a lead frame finger using metals such as copper, brass and stainless steel without the need for gold or silver plating at the bonding surfaces and without the need for gold or silver bonding wire. A feature and advantage of the elimination of gold or silver plating of the lead frame elements is that the extensive handling and shipping of the reels of lead frame ribbon is minimized thereby reducing the level of damage suffered by the ribbon as a result of such handling.

Another object of the invention is to achieve bonding of lead wire between an integrated circuit chip and lead frame finger at differential temperatures, with the chip at a safe level temperature below the level at which damage might occur, while the lead frame finger is at temperatures significantly higher including the melting point temperature of the lead frame metal and temperatures at which damage might occur at the chip.

A further object of the invention is to provide a welding method at the lead frame finger by which the primary energy for the weld is applied to the lead frame finger while it is isolated from electrical and thermal coupling with the chip. The invention also achieves intense but controlled application of energy for the weld without oxidation of the metal at the bond and while insuring the quality of the weld.

Furthermore, of course, the elimination of gold and silver plating and gold and silver lead wires offers substantial savings in the mass production of IC chips.

DISCLOSURE OF THE INVENTION

In order to accomplish these results the present invention provides a method for welding a lead wire or bonding wire from a microcircuit chip mounted on a lead frame to a lead frame finger by preheating the lead frame finger prior to any substantial electrical or thermal coupling between the lead frame finger and chip. By this expedient, intense but controlled energy for the weld may be applied to the lead frame finger at levels which might otherwise damage the integrated circuit chip. According to the invention the welding method is initiated by defining a bonding zone or welding zone for carrying out the method, flooding the bonding zone with an inert gas, and bonding the end of the lead wire to a circuit chip die pad at a first safe level temperature below the temperature at which damage might occur to the circuit chip. Such bonding of the end of the lead wire to the chip is typically effected ball bonding.

The invention contemplates preheating the lead frame finger by application of electrical energy prior to electrical or thermal contact of the capillary bonding tool or lead wire with the lead frame finger. Thus, the lead frame finger remains isolated from the chip during preheating of the lead frame finger to a second temperature level and by application of energy at a level above the safe level at which damage might occur to the microcircuit. According to the invention lead wire may be bonded between the microcircuit chip and lead frame finger at differential temperatures and by application of differential welding energies. The lead wire is then bonded to the preheated or preenergized lead frame finger and after cooling is severed adjacent the bond.

According to one aspect of the invention, the lead frame finger is preheated to a temperature below the melting point of the metal comprising the lead frame. Bonding is thereafter effected by thermocompression or ultrasonic bonding with the capillary tool bearing against the lead frame finger only after the primary welding energy has been applied. For example, where the lead frame comprises red brass with a melting point in the range of 990° C. to 1025° C., the lead frame finger is preheated to a temperature in the range of approximately 500° C. to 900° C., far above the safe level at which damage might occur to the chip.

In another preferred form of the invention the preheating step comprises melting a portion of the surface of the lead frame finger thereby forming a molten pool or puddle in the surface prior to any electrical or thermal coupling between the lead frame finger and microcircuit chip. Bonding of the lead wire to the lead frame finger is effected by immersing a section of the wire in the molten pool and allowing the pool to harden. The lead wire may be selected to have a melting point higher than the melting point of the lead frame metal. For example copper wire having a melting point of 1083° C. may be used.

In order to preheat the lead frame finger a fine point electrode is positioned over the lead frame finger at the desired location on the lead frame finger for forming the bond. The invention contemplates generating a controlled pulse train for delivering a controlled amount of energy to the bonding location and discharging the pulses in an arc discharge between the electrode and lead frame finger for preheating to a predetermined temperature. A further feature and refinement resides in generating a first pulse of relatively higher voltage and lower current for ionizing the gas between the electrode and lead frame finger surface, and generating a second pulse train of relatively lower voltage and higher current for delivering controlled amounts of energy for preheating of the lead frame finger.

The energy delivered to the lead frame finger by the pulse train may be controlled by counting the number of pulses or by controlling the time duration of the pulse train. Within a controlled pulse train of preset duration further flexibility is possible by varying parameters of the pulses such as pulse width, duty cycle, amplitude or frequency, to achieve different specified temperatures or to form molten pools of different volume at the lead frame finger. In one example, the lead frame finger comprises an outer layer of stainless steel and the molten pool is formed in the stainless steel. The molten pool or puddle may be restricted to the stainless steel layer by controlled application of the pulse train.

The invention also provides an apparatus for welding lead wire from a circuit chip on a lead frame to a metal lead frame finger by preheating of the lead frame finger. The apparatus includes an inert gas enclosure or bowl including a base and sidewalls forming at least a partial housing and defining a welding and bonding zone. A first inert gas source is provided for generalized distribution and flooding of inert gas in the space defined by the enclosure. Provision is made for feeding a lead frame strip through the enclosure or bowl. A fine point electrode is mounted in the enclosure over a selected lead frame and lead frame finger by an appropriate mounting mechanism. A capillary wire holding tool support is also provided.

The apparatus includes a circuit comprising the electrode and selected lead frame finger, and a pulse generator for generating a controlled electrical pulse train of controlled duration coupled to the circuit for discharging the pulses between the electrode and lead frame finger for delivering a controlled amount of energy to the lead frame finger. A full disclosure of one example of such a pulse generator and counter for delivering a pulse train of a preset count of electrical pulses is found in copending U.S. patent application Ser. No. 262,595 referred to above and incorporated herein by reference. The invention contemplates further embodiments for delivering a pulse train by controlling the time duration of the pulse train as hereafter described. A second inert gas source is also provided for delivering a directed stream of inert gas for cooling and purging in the vicinity of the selected lead frame and lead frame finger.

In a further feature of the apparatus the pulse generator actually includes a first pulsed power supply for generating a first spike pulse of relatively high voltage and low current to effect ionization of gas between the electrode means and lead frame finger. A second pulsed power supply is also provided for generating a second pulse train of a preset count of electrical pulses. The second pulse train comprises pulses of relatively lower voltage and higher current for delivering a controlled amount of energy to the lead frame finger. For example, the first pulsed power supply is constructed to deliver a voltage for example in the range of 4 kV to 10 kV while the second pulsed power supply delivers a voltage, for example in the range of 600 V to 750 V. The frequency of the pulses may be in the range of, for example the line frequency of 60 Hz to 1.5 kHz. The pulsed power supplies are coupled by a logic gate for sequenced operation.

Other objects, features and advantages of the present invention will be apparent in the following specification and accompanying drawings.

BRIEF DESCRIPTION OF DRAWINGS

FIG. 1A is a side view of a portion of a lead frame showing a lead wire bonded between a chip die pad and a lead frame finger according to the prior art.

BEST MODE FOR CARRYING OUT THE INVENTION

Figure 1:
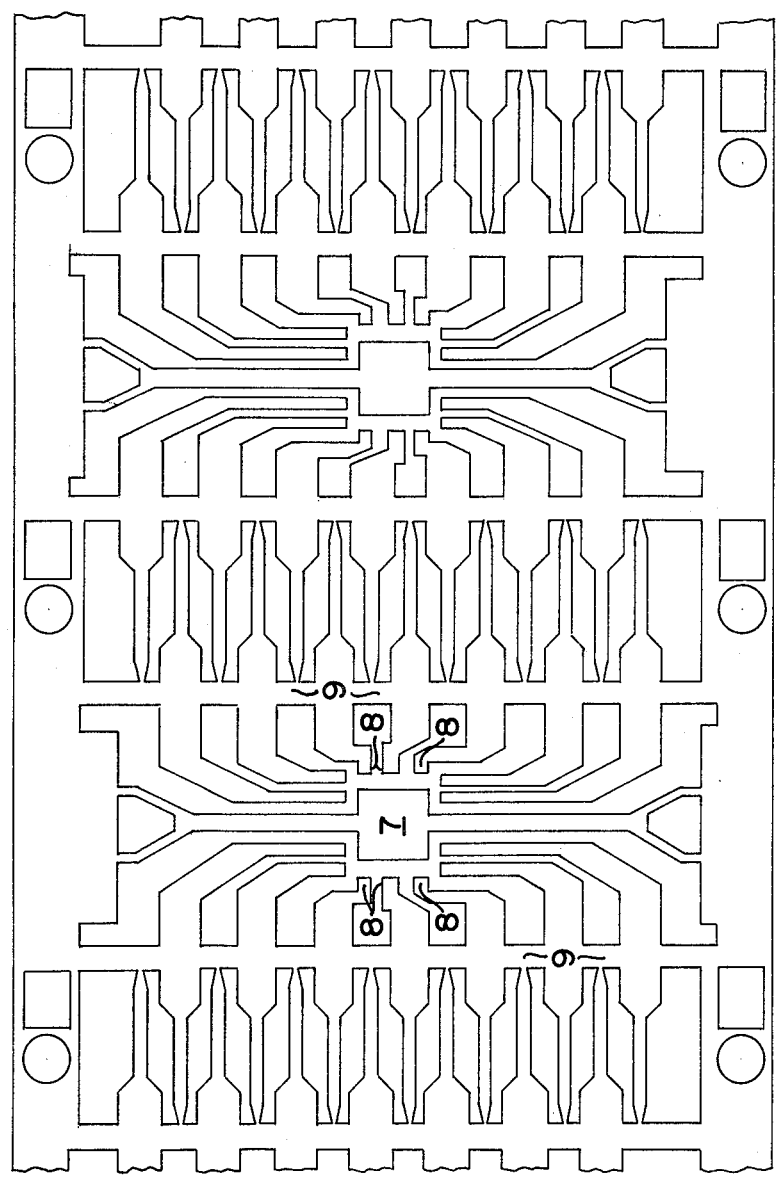
FIG. 1 is a fragmentary plan view of a lead frame strip according to the state of the art.
Figure 2:
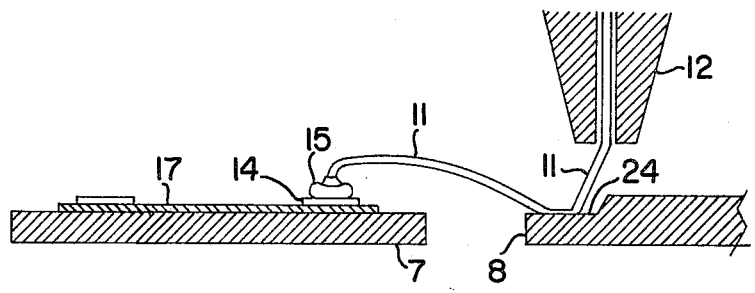
FIG. 2 is a diagrammatic view of a preheating electrode in position over a lead frame finger according to the present invention.
Figure 2:
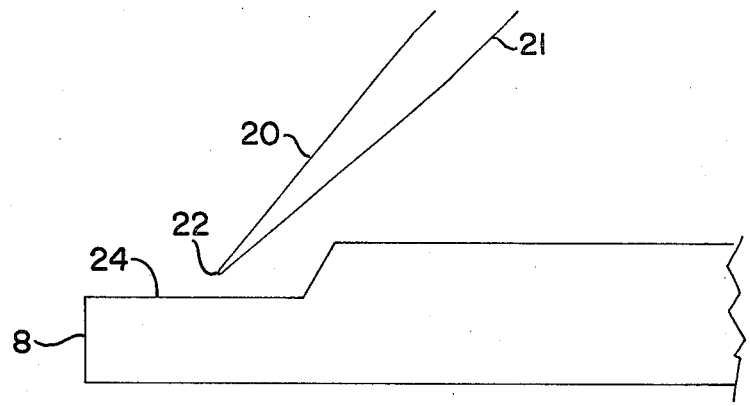

In the embodiment of the present invention illustrated in FIGS. 1-8, bonding of lead wire from a microcircuit chip to the lead frame is effected by preheating each lead frame finger prior to electrical coupling or contact of the lead wire to the lead frame finger. This is generally accomplished by positioning a fine tipped electrode 20 over a lead frame finger 8 as shown in FIG. 2, for delivering a controlled amount of electrical energy to the bonding location. Electrical energy for preheating is delivered by discharging a controlled pulse train in an arc discharge between the electrode and lead frame finger all in an inert gas environment. A suitable electrode 20 is provided by a tungsten rod 21, for example 40 mils in diameter, melted and drawn to a point 22 one to several mils in diameter. The electrode is mounted for positioning sequentially over each lead frame finger, and for extension and retraction so that the electrode tip 22 is at the desired distance over the bonding location.

The lead frame finger is typically 10 mils thick and 10-14 mils wide formed of a metal such as stainless steel or red brass. For achieving temperatures above the melting point of the metal comprising the lead frame finger a spacing between the electrode tip 22 and the bonding surface 24 of 3-5 mils is desirable. Melting point temperatures are necessary for "puddle bonding" according to the invention as hereafter described. For preheating to temperatures below the melting point to facilitate thermocompression welding according to the invention a spacing between the electrode and bonding surface of 5-15 mils and preferably 5-10 mils is desirable.

As hereafter more fully described the apparatus of the present invention is mounted in a bonding machine of the type prevalent in the industry for bonding lead wire between a microcircuit chip and the lead frame on which it is mounted. Such a conventional bonding machine is of course modified in accordance with the present invention as hereafter described. An example of such a bonding machine suitable for adaptation according to the present invention is the High Speed Tailless Thermocompression Ball Bonder Model 478 of Kulicke and Soffa Industries, Inc. The elements of such a machine alluded to hereafter are described for example in the Kulicke and Soffa *Model 478 Handbook*.

Figure 3:
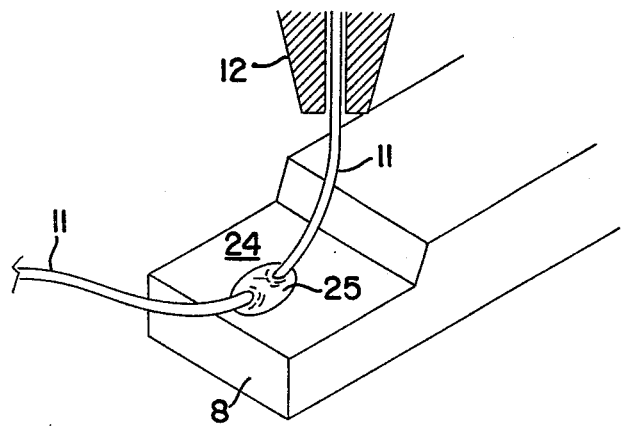
FIG. 3 is a perspective view and FIG. 3A a plan view of a "puddle bond" or bond formed in a molten pool according to the invention.
Figure 3A:
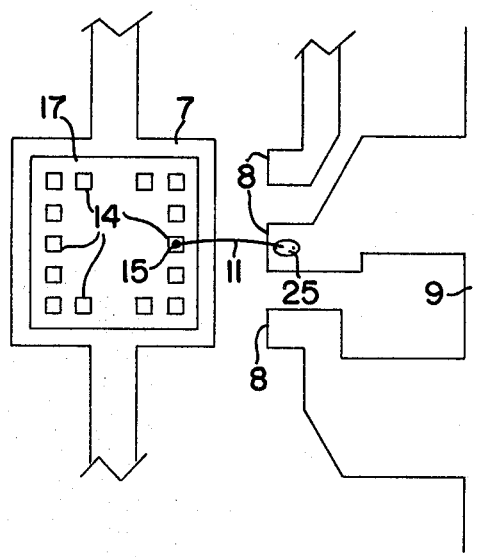

For puddle bonding according to the present invention energy delivered to the surface 24 of lead frame finger 8 is controlled to from a molten pool or "puddle" for example 3-6 mils in diameter and of comparable depth. The electrode 20 is retracted so that capillary tool 12 from the bonding machine may move into position and immerse a section of the bonding wire 11 in the molten pool or puddle 25 as shown in FIG. 3. After sufficient cooling and hardening of the pool 25 at the bonding location, which cooling is facilitated and enhanced by a stream of argon or other inert gas as hereafter described, the bonding wire or lead wire 11 is clasped or grasped by the bonding machine tool and parted or severed at the bonding location. The end result is a secure lead wire bond with good electrical contact between the circuit chip die pad 14 and lead frame finger 8 without the need for silver or gold plating of the lead frame elements as shown in FIG. 3A.

Figure 2A:
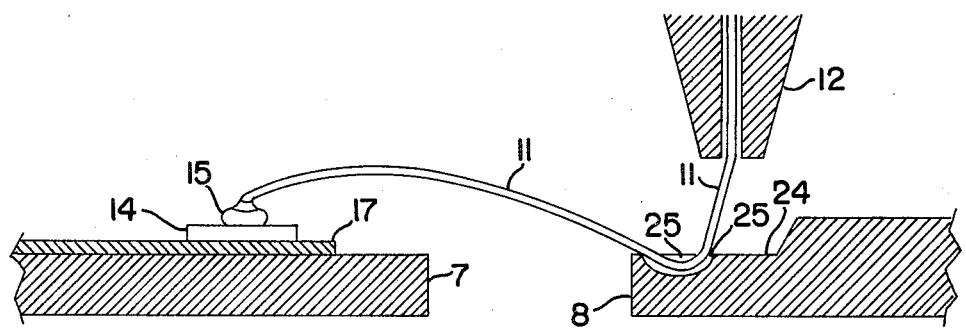
FIG. 2A is a cross section of a deep "puddle bond" or bond formed in a molten pool according to the present invention showing the lead wire bonding to the lead frame finger.
Figure 2B:
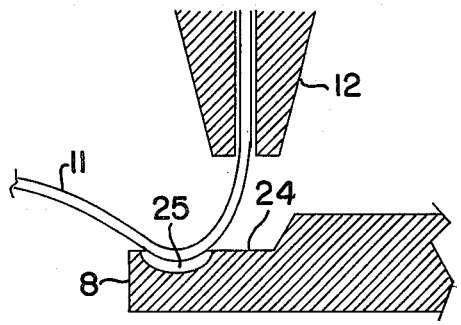
FIG. 2B is a cross section of a shallow "puddle bond" of the lead wire to the lead frame finger according to the present invention.

Referring to FIGS. 2A and 2B in which the previously identified elements are designated by the same reference numerals, puddle bonds of different depths are shown. A "deep puddle bond" is shown in cross section in FIG. 2A where the lead wire 11 has been solidified in a deeper pool originally extending approximately half the depth or thickness into the lead frame finger 8. In the cross section of FIG. 2B the lead wire 11 has hardened and welded into the very surface 24 of lead frame finger 8. Thus, only a shallow molten pool is required in the latter instance for puddle welding the bonding wire at the surface.

Figure 2C:
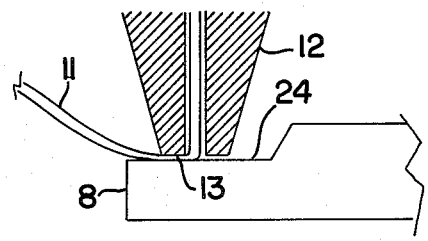
FIG. 2C is a surface bond of the lead wire to the lead frame finger according to the present invention.

For enhanced thermocompression bonding or other preheat enhanced welding according to the present invention the energy delivered to surface 24 of the lead frame finger by electrode 20 is controlled to achieve a high temperature but below the melting point of the metal comprising the lead frame finger. The electrode 20 is then retracted so that capillary tool 12 may move into position and effect a thermocompression wedge bond in which the lower bearing edge 13 of tool 12 applies pressure to the lead wire against the surface 24 of lead frame finger 8 resulting in the wedge bond of FIG. 2C. Unlike the prior art wedge bond, however, the lead frame finger 8 was first preheated to a temperature approaching but below the melting point of the metal permitting an efficient and effective wedge bond without the necessity for gold or silver plating of the lead frame elements and without the necessity of using gold and silver lead wires.

With respect to the desired temperatures and related parameters for puddle bonding and preheat enhanced welding according to the present invention, reference is made to Table I. It is apparent that for lead frame elements of red brass temperatures exceeding 990°–1025° C. must be achieved at the bonding location in the finger surface 24 for molten pool immersion bonding or puddle bonding. On the other hand, for enhanced preheating thermocompression welding or ultrasonic welding temperatures in the range of 500°–900° C. are desirable. For stainless steel lead frames, local temperatures at the finger surface exceeding 1400°–1455° C. must be achieved for molten pool immersion bonding. For enhanced preheating welding sub-melting point temperatures of 800°–1300° are preferable. Parameters for further exemplary metals are set forth in Table I.

It is apparent from the physical constants listed in Table I that the low thermal conductivity of stainless steel, a factor of 10 less than red brass, permits a longer retention time for the molten pool or "puddle" formed in stainless steel and therefore a longer period of time to effect the operation of immersing the lead wire in the molten pool. Even with red brass however, a puddle duration in the order of 1 to 2 seconds may be achieved affording ample time to effect the molten pool immersion bond. By using stainless steel the molten pool is retained for even a longer time.

Figure 2D:
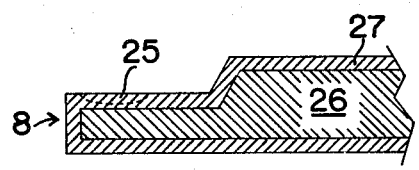
FIG. 2D is a side cross section of a lead frame finger having a copper alloy core and outer layer of stainless steel for use in the present invention.

In this regard, a lead frame finger element of the type illustrated in FIG. 2D may be used. In this embodiment of the invention the lead frame is formed by a core 26 of red brass or copper, coated, bonded or laminated with an outer layer 27 of stainless steel. This laminar combination on the lead frame elements provides the dual advantage that a shallow puddle 25 of long life may be formed in the stainless steel layer 27. Heat may still generally be conducted away with high thermal conductivity through the central core 26 of red brass or copper.

A feature and advantage generally of the molten pool immersion welding method of the present invention referred to herein as "puddle bonding" is that different metals which normally cannot be bonded at the low temperature and energy levels permitted in the vicinity of the microcircuit chip may now be securely welded or bonded together. For example copper wire may be bonded to brass or red brass without the necessity of plating the fingers with gold or silver. Bonding may similarly be effected to stainless steel, nickel, and aluminum by way of example and all without the necessity of plating of the contacting elements. Furthermore, lead wires of metals other than silver or gold may be used.

Figure 4:
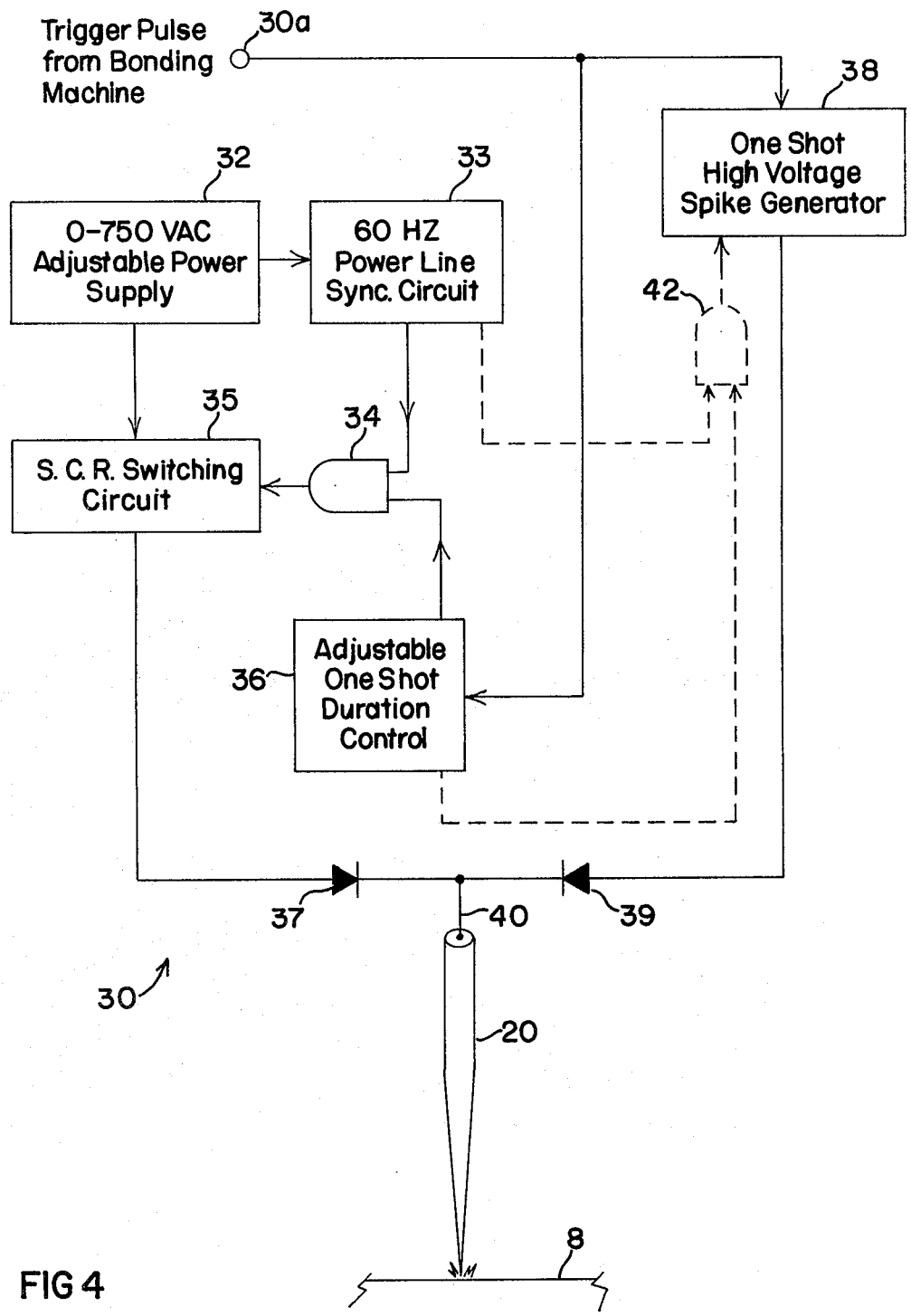
FIG. 4 is a system block diagram of the electrical system coupling of components and related apparatus for delivering a pulse train of controlled time duration.
Figure 4A:
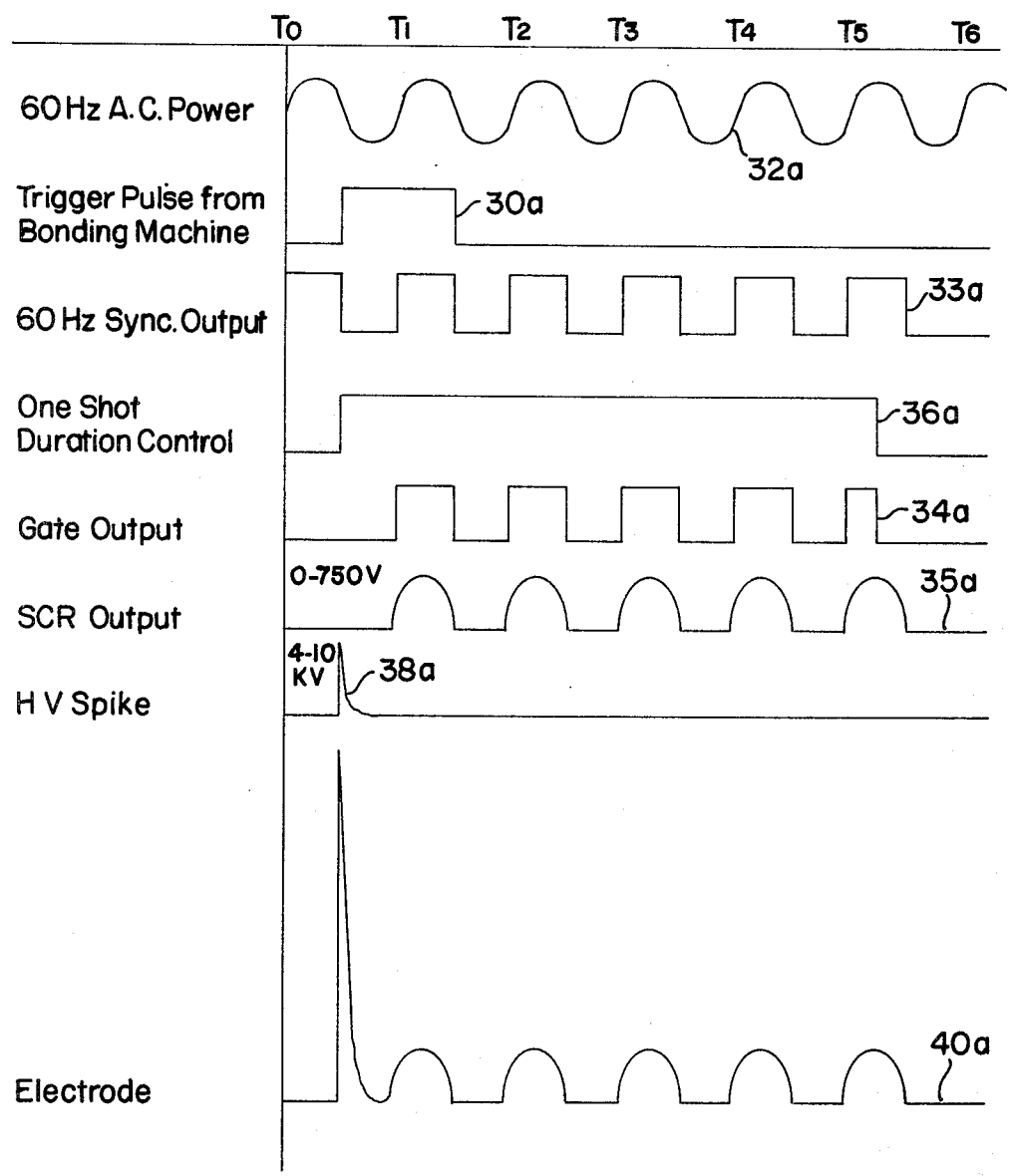
FIG. 4A is a timing diagram showing operation of the electrical system.

A suitable electric circuit and power supply for delivering a controlled amount of energy in the form of a controlled pulse train to the puddle forming or enhanced preheating electrode 20, is illustrated in FIG. 4. Electrode 20 is also referred herein as to the zapper electrode. A timing diagram showing operation of the components of the power supply is illustrated in FIG. 4A. The power supply 30 shown in FIG. 4 is a line frequency variable voltage DC power supply delivering DC pulses at 60 Hz in a range of up to for example 750 V. To this end there is provided a 0 to 750 V AC adjustable voltage power supply 32 delivering the sinusoidal AC output designated 32a in timing diagram 4A. The 60 Hz power line sync circuit 33 comprising a Schmitt trigger circuit, squares up the sine wave providing the output designated 33a in the timing diagram of FIG. 4A. The power line sync circuit output through gate 34 triggers SCR switching circuit 35 consisting of a silicon controlled rectifier.

Gate 34 however passes the trigger pulses from sync circuit 33 only for the duration during which the adjustable one shot duration control 36 is conducting. The one shot monostable multivibrator 36 is adjustable to provide a duration control signal designated 36a in the timing diagram of FIG. 4A for passing a controlled amount of energy of desired quantity measured by the time duration of the signal output 36a. The trigger pulses 34a at the output of gate 34 are therefore limited for the duration of the control signal 36a from adjustable one shot 36 as shown in the timing diagram of FIG. 4A. The duration control signal 36a from one shot 36 is initiated by the trigger pulse 30a from the bonding machine in which the apparatus and circuitry of the present invention is housed.

The output from SCR 35 designated signal 35 in the timing diagram of FIG. 4A therefore represents a rectified pulse train of positive pulses derived from the adjustable power supply 32 and of controlled duration determined by the control signal from one shot 36. The DC pulse train 35a of controlled duration passes through rectifier 37 to electrode 20 for arc discharge to the grounded lead frame finger 8 for puddle formation or enhanced preheating as heretofore described.

A further important element of the power supply is the one shot high voltage spike generator 38 which is actuated at the outset by the trigger pulse 30a from the bonding machine. The high voltage spike pulse output 38a from the voltage spike generator 38 precedes the pulse train 35a to initiate ionization of air between the electrode 20 and lead frame finger 8. While the voltage amplitude of the rectified DC pulses 35a as in the order of up to 750 V, the single preceding ionization spike 38a has a voltage in the order of 4 to 10 KV. The voltage spike represents a very high voltage but very low current pulse of energy to initiate an ionized path between electrode 20 and lead frame finger 8 along which the lower voltage higher current pulse train of controlled duration 35a conducts for delivering a controlled amount of energy to the bonding location at the lead frame finger via arc discharge from electrode 20. The high voltage spike passes through rectifier 39 to the electrode.

Rectifiers 37 and 39 isolate the controlled pulse train generating side of the power supply from the initial high voltage spike generating side of the power supply. Rectifier 39 can be a solid state rectifier while a vacuum tube rectifier may be necessary for rectifier 37 because of the higher current for delivering energy for electrode 20. The combined output 40 applied to electrode 20 is indicated by signal 40a in the timing diagram of FIG. 4A. As there shown, the initial ionization spike precedes the pulse train providing a conductive pathway for the arc discharge of precisely metered energy.

Thus the line frequency variable voltage DC power supply 30 generates a rectified pulse output using only the positive alternation of the sine wave and gating the pulses with a time duration control signal thereby metering the energy delivered for bonding at the lead frame finger. In the example of FIG. 4 a negative ground is applied at the lead frame finger and electrons jump from the finger to the electrode 20. This may be advantageous where the lead frame finger 8 is at a higher temperature because of the heated work holder on which the lead frame strip is mounted as hereafter described. However, the electron discharge can be effected in either direction according to the present invention. The duty cycle of the pulses may be controlled by adding a Jones circuit for forced commutation at selected duty cycles.

It has been found according to the present invention that pulsing of energy to the electrode 20 permits more precise control and metering of energy delivered to the bonding location for puddle formation or enhanced preheating. Thus, delivering energy in the form of a pulse train of controlled duration affords more precise control over the delivered energy than can be achieved by a single pulse or current of variable duration. Furthermore, by providing energy in the form of a pulse train more parameters are available for greater flexibility in adjusting the energy delivered. For example, pulse frequency, pulse amplitude, pulse duration and duty cycle may be respectively varied in addition to the overall duration of the pulse train. Furthermore, energy in digital form may be more precisely gated according to the present invention.

At frequencies lower than the line frequency of 60 Hz an ionizing spike pulse may be necessary before each pulse of the pulse train to maintain ionization of the air between electrode 20 and lead frame finger 8. Thus, the combination of the delay between pulses at lower frequency and the flow of argon gas directed at the bonding site as hereafter described may blow out the arc. Therefore it may be desirable to include an ionization spike before each pulse when the argon or other inert gas flow reaches a critical level at frequencies of 60 Hz or lower which may extinguish the ionized path. For this purpose a further gate 42 may be introduced into the power supply 30 as shown in dotted outline in FIG. 4. One of the inputs to gate 42 is the power line sync circuit output 33a while the other input is the adjustable one shot duration control output 36a. The output of gate 42 triggers one shot high voltage spike generator 38 at each pulse of the pulse train during the period of controlled duration defined by the adjustable one shot 36.

Figure 5:
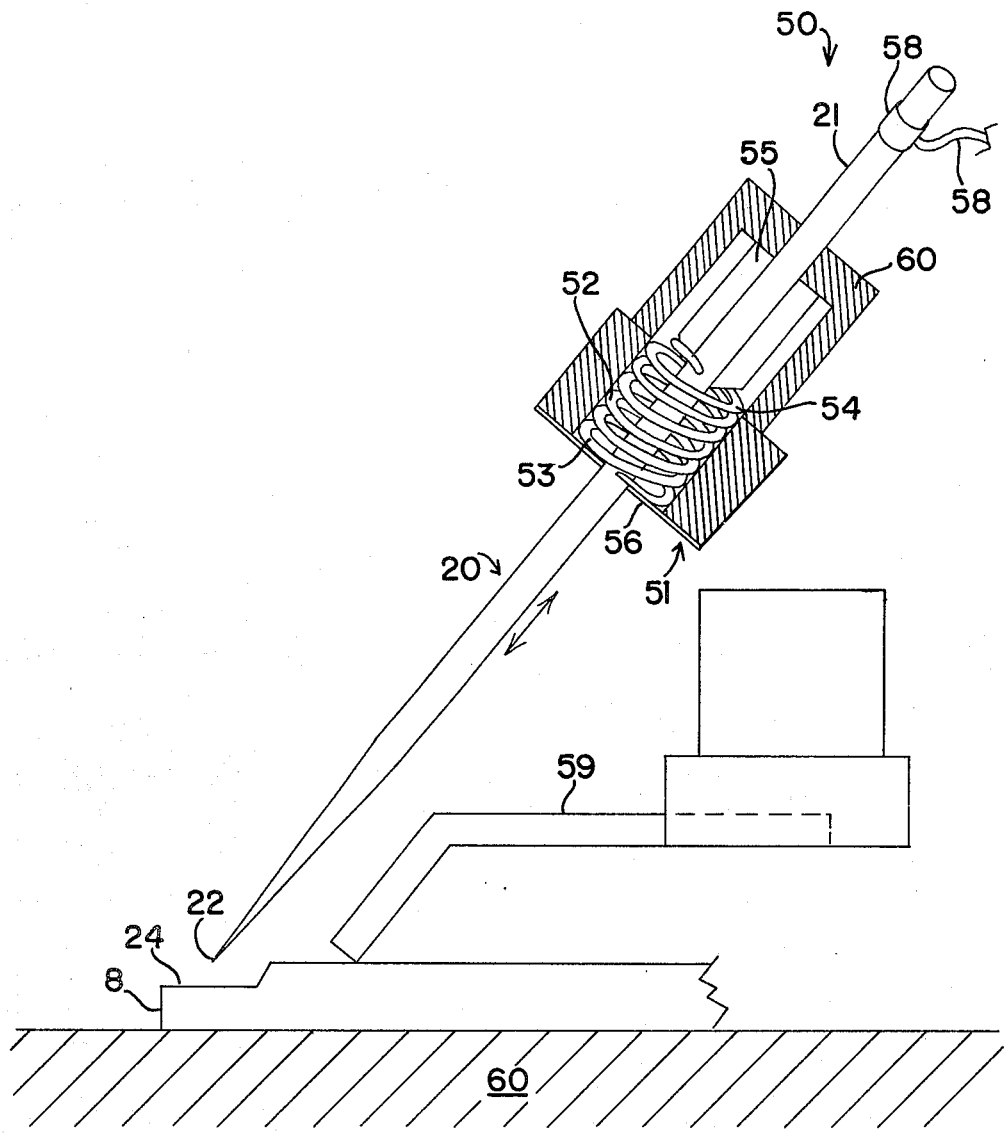
FIG. 5 is a block diagram of a mechanism and arrangement for mounting and moving the fine point electrode.

Mounting hardware and apparatus for the zapper electrode 20 is illustrated in FIG. 5. The electrode support 50 includes a mounting and bearing frame 51 containing a spring 52 which at the lower end 53 bears against the frame 51 and which at the upper end 54 bears against the solenoid plunger 55 connected to the electrode rod 21. The frame 51 is formed with a hole 56 through which the electrode 20 is inserted so that the electrode tip 22 projects in the vicinity of the bonding location on lead frame finger 8. Upon insertion of the electrode 20 through the hole 56 and mounting and bearing frame 51 spring 52 biases the electrode in an outward moving or retracting direction which may be counteracted when solenoid 60 is actuated. Upon actuation of solenoid 60 plunger 55 which is fixed and secured to the electrode rod 21 is biased to move a predetermined distance compressing spring 50 and maintaining the spring under compression. The electrode tip 22 is moved to the desired spacing distance from surface 24 of lead frame finger 8. The output from power supply 30 of FIG. 4 is connected by lead wire 58 to the end of electrode 20 for delivering a controlled amount of energy in the form of the pulse train of controlled duration. The work holder 90 (FIGS. 6 & 7) includes a lead frame hold down clamp 59 for bearing against the trunk portion of lead frame finger 8 when the electrode and electrode frame 51 have been positioned over the lead frame.

A feature and advantage of lead frame hold down clamp 59 is that it prevents or attenuates relative motion of lead frame finger 8 with respect to the heated work holder surface 60 on which the lead frame strip is supported as hereafter further described. Relative motion of finger 8 in the vertical direction of as much as 1 to 3 mils is otherwise possible significantly varying the spacing between electrode tip 22 and surface 24 of the lead frame finger critical to the delivery of a controlled amount of energy for bonding at the finger. Thus, the spacing between electrode tip 22 and surface 24 may be as little as 3 to 5 mils during preparation for a puddle bond or molten pool immersion bond. For enhanced preheating bonding where the spacing may be in the order of 5 to 15 mils the motion of finger 8 may not be as critical. In either event lead frame hold down clamp 59 prevents significant variation in the electrode to surface spacing.

As hereafter more fully described the electrode mounting and bearing frame 51 is precisely mounted and controlled on a lever arm coupled to the bonding machine for positioning and indexing of the zapper electrode mounting apparatus over the selected lead frame of a strip supported on the work holder surface 60.

Figure 6:
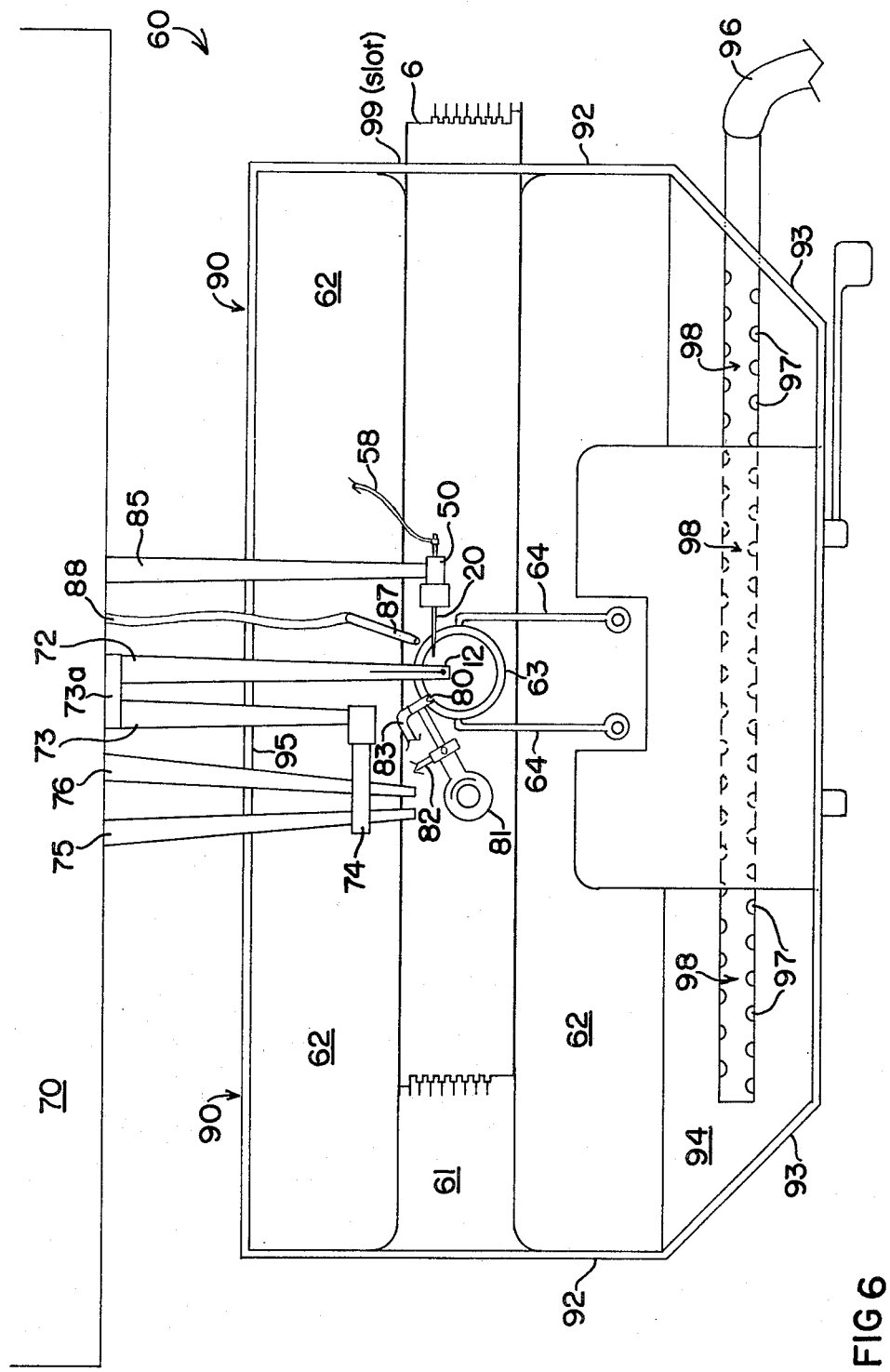
FIG. 6 is a diagrammatic plan view of a welding or bonding work holder zone enclosure and related apparatus according to the invention.
Figure 7:
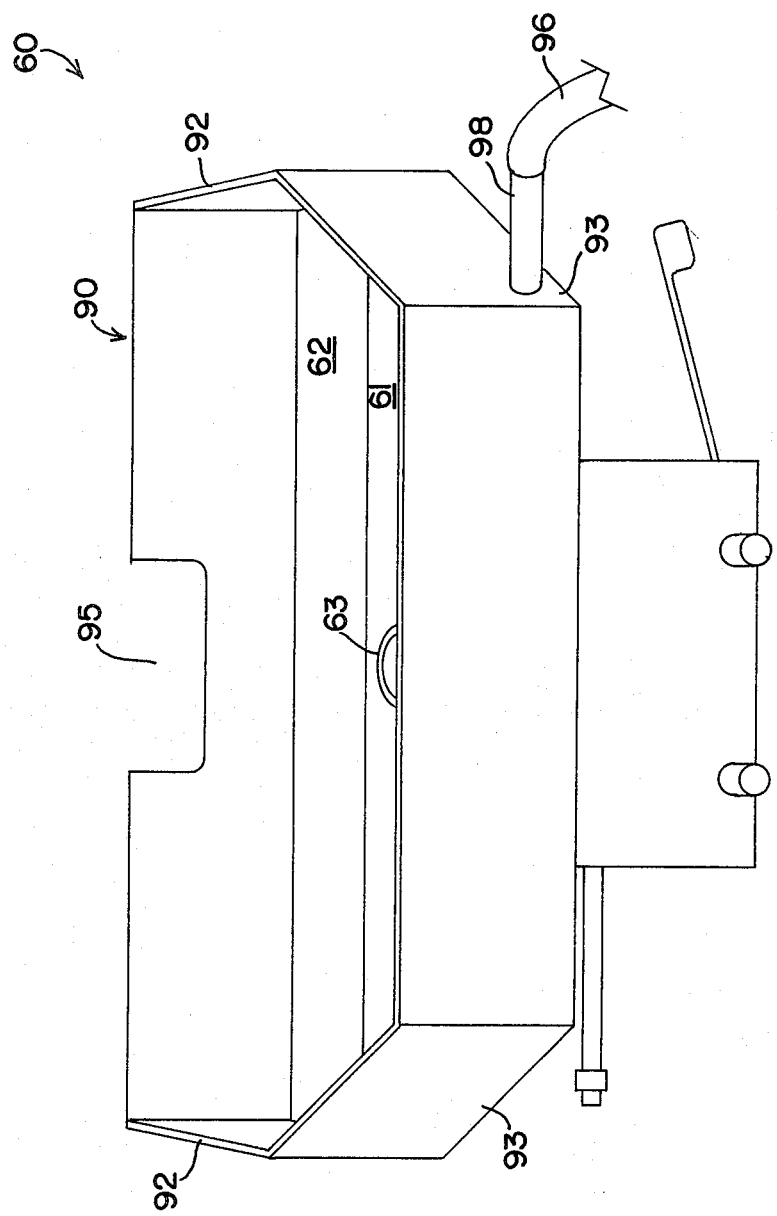
FIG. 7 is a diagrammatic perspective view of the work holder zone enclosure.

A bonding machine and work holder modified and adapted in accordance with the present invention is illustrated in FIGS. 6 and 7. Such a bonding machine 70 of the type described in the Kulicke and Soffa *Model 478 Handbook* includes a capillary tool holder 72 in which the capillary tool 12 is mounted for positioning over a microcircuit chip and lead frame of the lead frame strip 6 mounted on work holder 60. The capillary tool holder 72 is connected by coupling 73a to lever arm 73 which is in turn connected to the tool control rod 74. The tool output links or camming rods 75 and 76 in turn controlled by the bonding machine 70 bear against the tool control rod 74 for alternatively raising and lowering the capillary tool holder 72 for accurate positioning of the capillary tool 12 relative to a particular lead wire bonding location.

Also mounted on bonding machine 70 is a flameoff arc electrode 80 pivotally mounted on arm 81 whose rotational position is controlled by a lever arm 82 now shown supported at and coupled to the bonding machine 70. Flameoff electrode 80 includes an argon shield 83 for delivering argon or other inert gas to the ball forming arc flameoff site. The ball forming flameoff arc electrode is used in the formation of a ball at the end of lead wire 11 held by capillary tool 12 prior to ball bonding of the end of the lead wire to the die pad of an integrated circuit chip mounted on a lead frame of strip 6. For a more complete description of the ball forming and ball bonding sequence which occurs prior to bonding of the lead wire to the lead frame finger, reference is made to our copending U.S. patent application Ser. No. 262,595 filed May 11, 1981 and entitled "Bonding Wire Ball Forming Method and Apparatus", further assigned to the assignee of the present invention.

In accordance with the present invention a further lever arm or rod 85 is adapted from the bonding machine 70 to support the zapper electrode mounting frame 50 and electrode 20 of the type described with reference to FIG. 5. This electrode frame holder 85 may be moved up and down in the same manner as tool holder 72. Lead wire 58 from electrode 20 extends into the bonding machine 70 where a power supply of the type described in FIG. 4 is housed according to the modification of the bonding machine according to the present invention. Additionally an argon source 88 is provided for delivering a stream of argon or other inert gas through nozzle 87 into the site of puddle bonding or enhanced preheating welding at a selected lead frame finger.

Thus, all of the operative elements and tools for effecting bonding of lead wire between a microcircuit chip and lead frame as set forth above are mounted from the modified bonding machine for operative positioning over the welding and bonding site all in accordance with bonding machine mechanical principles known in the industry.

The work holder 60 is a lead frame strip work holder of the type manufactured by Kulicke & Soffa Industries, Inc., 507 Prudential Road, Horsham, Pa. 19044, and described in the *Model 261 Universal IC/Transistor Workholder Handbook* published by Kulick & Soffa. Such a work holder 60 includes a strip guide or track 61 centered between guide rails 62 for feeding and guiding a lead frame strip 6 to the locus of lead wire bonding. The center of the work holder may be heated transferring heat to the strip. The bonding location is defined by a hold down clamp or ring clamp spring loaded by arms 64 against a particular lead frame of strip 6 centered at the locus of bonding and welding beneath the operative tools and positioning arms e.g. 72, 80, 82, 50, 85, 88 etc. projecting from the bonding machine 70.

Work holder 60 however has been modified according to the present invention to provide an inert gas enclosure or bowl 90 comprising walls 92 formed around the upper surface and bearing surface of the work holder. Thus, the guide track 61 and guide rails 62 form the base or floor of the inert gas enclosure 90 with side walls fitted to conform to the periphery of the work holder. In the areas in which the work holder does not provide or define a floor for the enclosure, particularly at the extended walls 93, floor portions 94 are provided attached to the extended wall portions 93 to meet and abut against the existing surfaces 62 of work holder 60. While the enclosure is not entirely air tight, it need not be provided it defines a substantially argon or other inert gas environment entirely around the region of welding and bonding and provided the inert gas is continually replenished. The rear wall of the enclosure is provided with a cutout portion 95 for receiving the operative bonding tools from bonding machine 70 in the vicinity of ring clamp 63.

Generally, the workholder enclosure is twice as long as a lead frame strip 6 for loading the strip, advancing the strip to the bonding position, and unloading the strip. Strips 6 are loaded into and unloaded from the workholder enclosure 90 through respective slits 99 formed in the walls 92 at the ends of the enclosure.

In order to replenish and maintain the inert gas environment, a source 96 of inert gas is provided leading to a distribution tube 98 provided and positioned along the side at the base of the enclosure. Distribution holes 97 along the length of the tube 98 assure a complete flooding of the enclosure with inert gas. Thus, argon source 96 and distribution tube 98 also referred to herein as the first argon source or first inert gas source provide a large volume low pressure source of inert gas for flooding the entire enclosure. This arrangement and function of the first argon source 96 differs substantially from the second argon source 88 and 87 which functions as a nozzle for delivering a lower volume higher pressure and velocity stream of gas directly at the bonding location on the lead frame finger. The second argon source 88, 87 assures inert gas protection directly at the high temperature location of welding according to the present invention and also performs a cooling function in efficiently removing heat from the welding zone. Thus, the first argon source is for flooding the enclosure while the second argon source is for providing a directed stream.

The entire workholder 60 modified in accordance with the present invention is mounted before the bonding machine 70 on a chessman and base, not shown, which permits universal movement of the workholder 60 beneath the operative bonding tools projecting from the bonding machine. The chessman permits precise positioning of the selected microcircuit die pad beneath the capillary tool 12 for ball bonding the end of the lead wire to the die pad, and subsequently for precise positioning of the lead frame finger beneath the zapper electrode 20 in mounting frame 50 for puddle or pool formation or enhanced heating in accordance with the present invention. In the latter instance, the lead frame finger and bonding location may then be positioned beneath the capillary tool 12 for pool immersion welding and bonding of the wire or for enhanced preheating thermocompression bonding.

Figure 8:
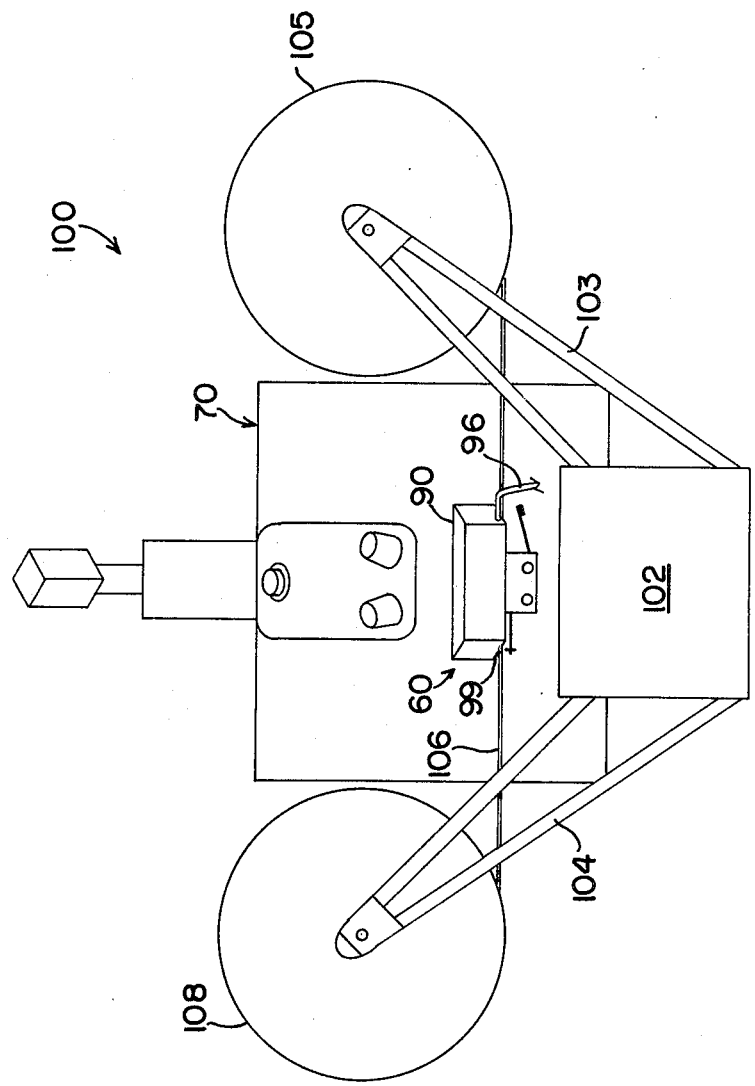
FIG. 8 is a front diagrammatic view of a reel to reel bonding machine according to the invention.

A lead frame reel-to-reel bonding system 101 according to the present invention is illustrated in FIG. 8. In the reel-to-reel system a bonding machine 70 and workholder 60 with enclosure 90 as described with reference to FIGS. 6 and 7 are provided. In this modification according to the invention, the base 102 on which the chessman and workholder 60 with enclosure 90 are mounted is provided with heavy duty reel mounts or supports 103 and 104 for rotatably supporting and mounting the large diameter heavy weight lead frame reels as shipped from the lead frame manufacturer. Lead frame ribbon feed reel 105 feeds a continuous lead frame ribbon 106 through the loading slot 99 of workholder 60 and its enclosure 90 to the welding and bonding working zone within the workholder enclosure. The ribbon then passes out the unloading slot and onto the takeup reel 108. In this manner the cutting and handling of separate strips is avoided. Because the reels may be used directly from the manufacturer without plating with silver or gold, handling and damage is of course minimized.

Figure 9:
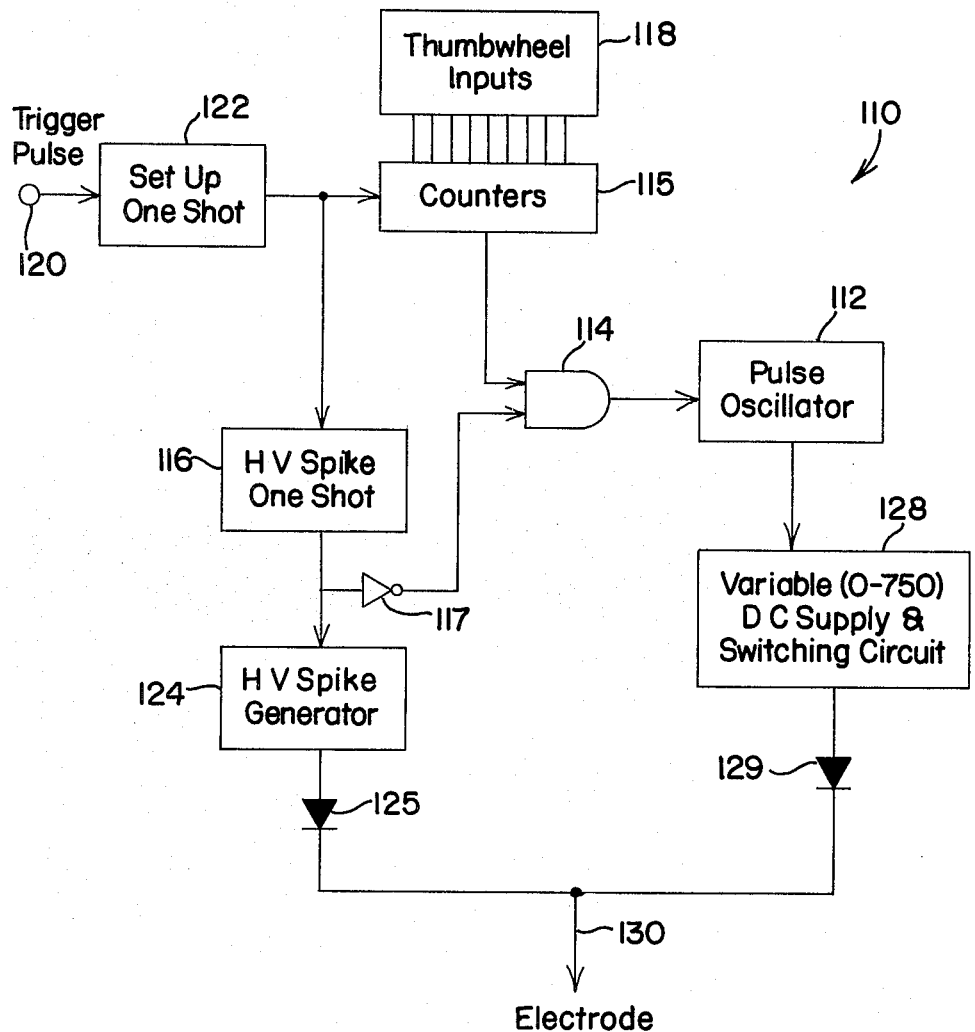
FIG. 9 is a block diagram of another controlled pulse train power supply for use in the present invention in which the pulse train and energy delivery are controlled by counting pulse and in which the pulse frequency and duty cycle are variable.
Figure 10:
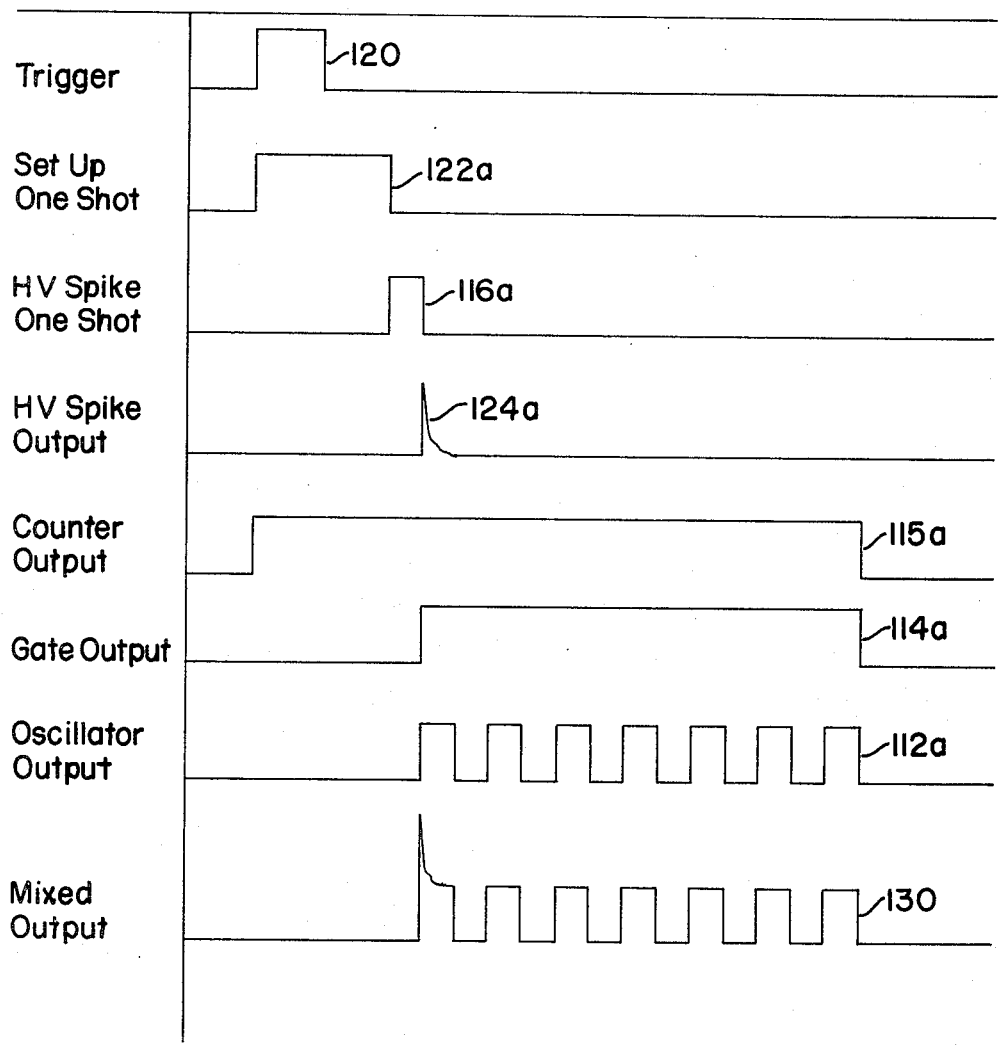
FIG. 10 is a timing diagram showing operation of the power supply of FIG. 9.

An alternative power supply according to the present invention for delivering a controlled pulse train and a precisely metered quantity of energy to the bonding site of a lead frame finger is illustrated in FIG. 9, with a timing diagram showing operation of the components of the power supply presented in FIG. 10. According to this embodiment of the invention, metering of the delivered energy is accomplished by counting the pulses of the pulse train and delivering a preset count of electrical pulses. A variable frequency power supply 110 is shown in FIG. 9 with a separate pulse oscillator 112 for delivering pulses at an adjustable selected frequency. The pulse oscillator 112 which generates the pulse signal 112 of FIG. 10 is controlled by gate 114 which actuates the pulse oscillator only for the duration of the gate control output signal 114a. The gate 114 is in turn jointly controlled by the outputs from the counters 115 and high voltage spike one shot 116 having respective output signal traces 115a and 116a as shown in the timing diagram of FIG. 10. The output of one shot 116 is inverted by inverter 117 prior to input to gate 114. Thumbwheel inputs 118 are used to set the counters 115 to a preset count for metering the energy ultimately delivered to the electrode 20.

A trigger pulse 120 from the bonding machine actuates the set up one shot 122 which delivers signal pulse 122a to actuate the counters and high voltage one shot 116. The high voltage one shot actuates the high voltage spike generator which delivers the high voltage spike pulse 124a through diode 125 to the electrode 20. At the same time the output from high voltage spike one shot 116 after inversion and in combination with the counters actuates the pulse oscillator to deliver the preset count of electrical pulses to actuate the variable voltage (e.g. 0–750 V) DC power supply and switching circuit 128 delivering DC pulses through rectifier 129 to the electrode. DC power supply 128 is of the type illustrated and described with reference to FIG. 4.

The high voltage spike 124 a in combination with the DC pulses 112a provide the mixed output 130 as shown in the timing diagram of FIG. 10. Thus, the power supply of FIGS. 9 and 10 deliver a controlled amount of energy for puddle bonding and enhanced preheating welding according to the present invention by delivering a preset count of electrical pulses. Further details of a similar power supply for delivering a preset count of electrical pulses for metered arc discharge of energy is found in our copending patent application Ser. No. 262,595 filed on May 11, 1981 and entitled "Wire Bonding Ball Forming Method & Apparatus", referred to above.

Figure 11:
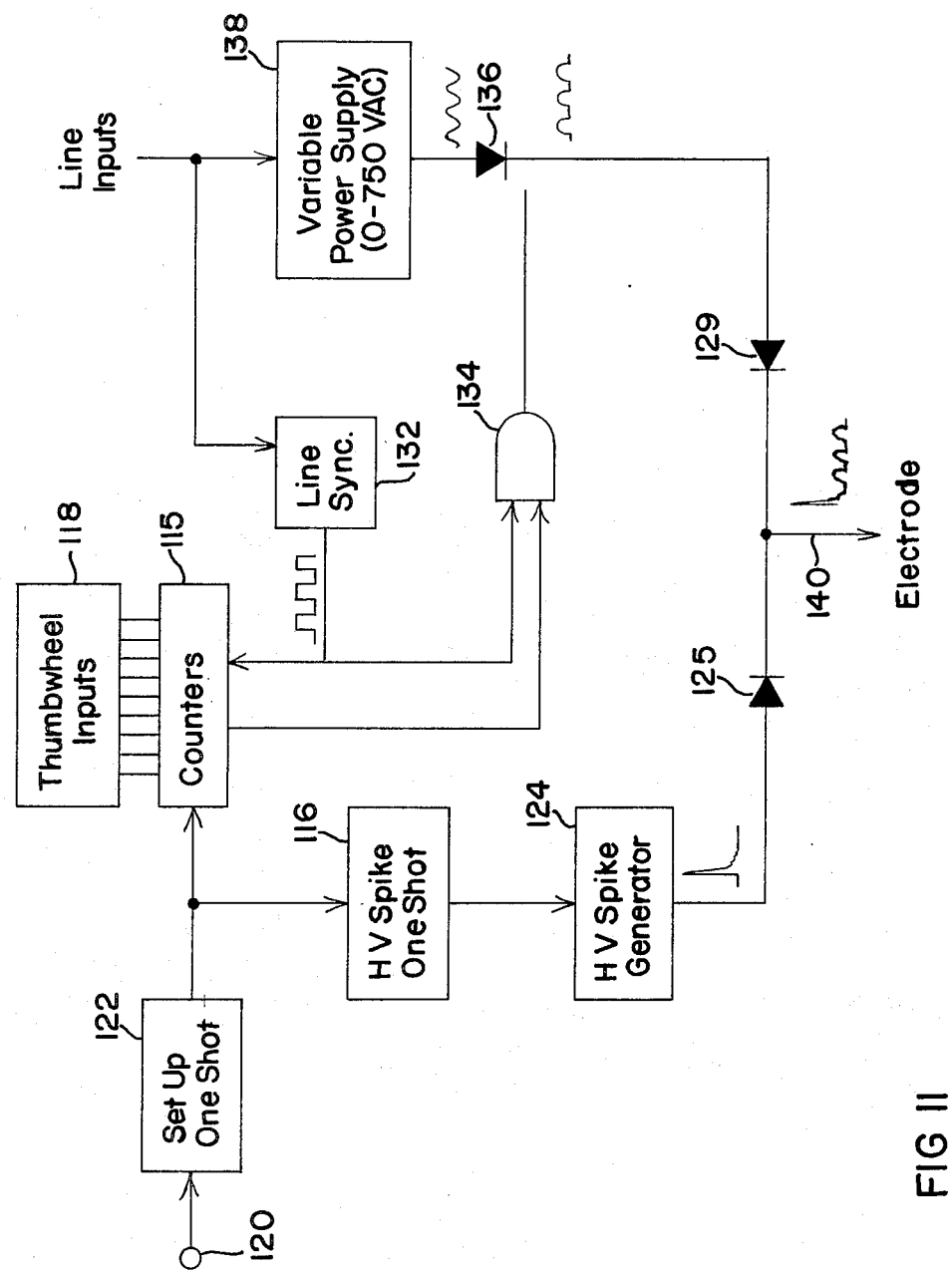
FIG. 11 is a block diagram of a variable voltage fixed line frequency (60 Hz) controlled pulse train power supply.

Yet another alternative power supply in the form of a fixed line frequency variable voltage power supply is illustrated in FIG. 11. This power supply is similar to that described with reference to FIG. 9 except that the fixed line frequency power supply at 60 Hz is used. In the block diagram of FIG. 11 those components identical with FIG. 9 are designated by the same reference numerals. In this instance a line sync circuit 132 is added to actuate the counters and the line sync output in combination with the outputs from counter 115 control the gate 134 providing counted pulses to gate the output through SCR 136. SCR 136 passes the positive alternation of the output from variable voltage (e.g. 0–750 VAC) AC power supply 138. Counted D.C. pulses amounting to a pulse train of a preset count of electrical pulses therefore pass through rectifier 129 to provide a combined output with the high voltage spike in which the spike preceeds the pulse train.

In the case of both the variable frequency power supply of FIG. 9 and the fixed line frequency power supply of FIG. 11 the high voltage spike generator may comprise a 12 volt DC supply, switching transistor, and induction coil for generating the spike voltage in the range of 4–10 Kv. The switching transistor is turned on and shut off by the one shot pulse from one shot multivibrator 116.

Furthermore in the case of both circuits the duty cycle of the pulses of the counted pulse train may be varied. With the separate square wave pulse oscillator 112 of FIG. 9 the duty cycle is easily controlled at the oscillator. In the fixed line frequency power supply of FIG. 11 the duty cycle can be controlled by adding a Jones circuit for forced commutation.

Prior to actuation of either of the alternative power supplies by a trigger pulse from the bonding machine the spacing between electrode 20 and lead frame finger 8 is first set and adjusted at the desired spacing by means of a feeler gauge, by means of eye placement through a microscope and reticle associated with the bonding machine, by touching the lead frame finger surface with the electrode to complete an electric circuit then pulling back a specified distance, or by means of test pulses preceeding the high voltage spike and controlled pulse train, etc. An electrode two cm. long is provided for purposes of such manipulation. A warning indicator may be provided when a circuit is made by unintended contact between the electrode and lead frame.

The power supplies may be adjusted to yield a variety of temperatures relative to the metals used for the lead wire and lead frame finger. For example, the melting point of the lead wire metal may be selected to be higher or lower than the melting temperature of the lead frame finger in which the molten pool or enhanced preheating is effected. And temperatures in the lead frame finger either below or above the melting point may be achieved according to the bonding method.

Furthermore in the case of puddle bonding, molten pool immersion bonding may be accomplished according to a variety of methods once the molten pool or puddle of desired volume is formed in the lead frame finger. The molten pool or puddle is typically no greater than one third to one half the width and thickness of the lead frame finger. By way of example, the wire may be immersed directly into the molten pool thereafter letting the puddle solidify. For this approach it is desirable that the melting point of the wire be higher than the melting point of the lead frame finger metal. According to a second approach, the wire is pushed ultrasonically into the puddle just as it solidifies. In this event the lead wire metal may have a melting point lower than that of the lead frame finger metal. Or, the lead wire can be welded by the capillary tool to the lead frame finger by ultrasonic welding or thermocompression welding just as the finger metal solidifies. Finally, the weld may be effected after the molten pool or puddle has solidified.

To prevent heat from being conducted from one finger to adjacent fingers, the dam bar is cooled by a heat sink. The surface mass of the workholder on which the lead frame strip is supported can serve this purpose. The center portion of such workholder surfaces are presently provided with a heater for which water cooling or other cooling may be substituted for carrying off even more heat energy. For low speed operation however, a thermal mass without water cooling is sufficient. Furthermore, the fingers must be electrically isolated from each other to prevent electrical pulses at adjacent fingers from traveling to the chip via previously bonded and welded lead wires. The heat sink at the dam bar may also be grounded to accomplish this purpose. As a result all high voltage or high current pulses are discharged at electrically isolated fingers and high energy delivery does not occur at any finger electrically connected to the chip.

While the invention has been described with respect to particular example embodiments it will be appreciated that it is intended to cover all modifications and equivalents within the scope of the appended claims.

TABLE I

|  | Red Brass 85 Cu 15 Zn | 304 Stainless Steel 18 Cr 8 Ni 2 Mn 1 Si BAL Fe | Cu | Ni | Ag | Au | Al |
|---|---|---|---|---|---|---|---|
| Melting Point °C. | 990 1025 | 1400 1455 | 1083 | 1453 | 960 | 1063 | 660 |
| Thermal Conductivity CAL/ CM-SEC-°C. | 0.38 | 0.039 | 0.93 | 0.198 | 1.0 | 0.71 | 0.50 |
| Density GM/CC | 8.75 | 7.90 | 8.93 | 8.91 | 10.49 | 19.29 | 2.70 |
| Specific Heat CAL/GM-°C. | 0.09 | 0.12 | 0.092 | 0.11 | 0.056 | 0.031 | 0.21 |

We claim:

1. A method for welding bonding a lead wire or bonding wire held in the capillary bonding tool of a lead wire bonding machine to a die pad of an integrated circuit chip mounted on a lead frame and thereafter weld bonding said lead wire to a metal lead frame finger to provide an electrical lead wire coupling between the circuit chip die pad and the lead frame finger comprising:

defining a bonding zone for carrying out said method;
flooding said bonding zone with an inert gas;
ball bonding the end of said lead wire to a circuit chip die pad at a first temperature below the temperature level at which damage might occur to the circuit chip;
providing preheating electrode means separate from the bonding tool and positioning said preheating electrode means over the lead frame finger to which the lead wire is to be bonded;
preheating the lead frame finger to which the lead wire is to be bonded by application of electrical energy through said preheating electrode means while substantially isolating the lead frame finger from electrical or thermal coupling between the lead frame finger and circuit chip, and preheating said lead frame finger to a second temperature above the temperature level at which damage might occur to the circuit chip;
retracting said preheating electrode means and terminating application of electrical energy to said lead frame finger through the preheating electrode means prior to contact of the lead wire with said lead frame finger;
contacting the lead wire with the preheated lead frame finger and bonding a section of the lead wire to the preheated lead frame finger;
and serving said lead wire adjacent said bond at the lead frame finger.

2. The method of claim 1 wherein the step of preheating comprises preheating said lead frame finger to a temperature below the melting point of the metal comprising said lead frame and wherein the step of bonding a section of the lead wire to the preheated lead frame finger comprises thermocompression bonding or ultrasonic bonding.

3. The method of claim 2 wherein the lead frame finger comprises red brass and wherein said preheating step comprises preheating the lead frame finger to a temperature in the range of approximately 500° C. to 900° C.

4. The method of claim 1 wherein the step of preheating comprises melting a portion of the surface of said lead frame finger thereby forming a molten pool in said surface prior to any electrical or thermal coupling between the lead frame finger and circuit chip and wherein the step of bonding a section of lead wire at the lead frame finger comprises immersing a section of the wire in said molten pool and allowing the pool to harden.

5. The method of claim 4 wherein the lead wire comprises a metal having a melting point higher than the melting point of the metal comprising the lead frame finger.

6. The method of claim 1 wherein the step of preheating comprises:

relatively positioning said preheating electrode means and lead frame finger at the desired location on the lead frame finger for bonding;
generating an electrical pulse train of controlled duration for delivering a controlled amount of energy;
and discharging said pulses between the preheating electrode means and lead frame finger for preheating to a predetermined temperature.

7. The method of claim 6 wherein the step of generating a controlled pulse train comprises generating first pulse means means at relatively higher voltage and lower current for ionizing the gas between the preheating electrode means and lead frame finger surface and genrating a second pulse train of relatively lower voltage and higher current for delivering energy for preheating of the lead frame finger.

8. The method claim 1, including the step of providing preheating electrode means comprised of a tungsten needle with a point size in the ranoe of several mils or less.

9. The method of claim 6 further comprising the step of varying the duration of said pulse train for varying the controlled amount of energy delivered to the lead frame finger and therefore the preheating temperature at the lead frame finger by varying the number of pulses.

10. The method of claim 1 wherein said lead frame includes a dam bar and further comprising the step of coupling the dam bar of the lead frame to a heat sink for dissipating heat from the lead frame finger.

11. The method of claim 1 further comprising the step of providing preheating electrode means comprised of a tungsten needle with a point size in the order of several mils or less.

12. A method for welding lead wire or bonding wire held in the capillary bonding tool of a bonding machine to a metal lead frame finger where one end of the lead wire has already been bonded to a circuit chip on the lead frame comprising:

melting a portion of the surface of said lead frame finger thereby forming a molten pool in said surface while the lead frame is substantially isolated from electrical and thermal coupling between the lead frame finger and circuit chip, said melting achieved by positioning an electrode over the lead frame finger and applying electrical energy to the lead frame finger through the electrode thereby preheating the lead frame finger and forming the molten pool;

retracting the electrode and terminating application of electrical energy to said lead frame finger through the electrode prior to contact of the wire with said lead frame finger;

immersing a section of the lead wire in said molten pool;

allowing the pool to harden;

and serving the lead wire adjacent the surface of the lead frame finger.

13. The method of claim 12 wherein the step of melting a portion of the surface of said lead frame finger comprises:

relatively positioning said electrode over the lead frame finger surface at the desired location on the lead frame finger for forming said molten pool;

generating an electrical pulse train of controlled duration for delivering a controlled amount of energy to the lead frame finger;

and discharging said pulses between the electrode and lead frame finger surface for melting a pool of predetermined volume.

14. The method of claim 13 further comprising the step of varying the duration of said pulse train for varying the energy delivered to the lead frame finger and the volume of the molten pool.

15. The method of claim 13 wherein the step of generating a controlled pulse train comprises generating a first pulse spike at relatively higher voltage and lower current for ionizing the gas between the electrode and lead frame finger surface and generating a second pulse train of relatively lower voltage and higher current for delivering energy to the lead frame finger for forming the molten pool.

16. The method of claim 13 wherein the pulse train comprises first pulse means of relatively higher voltage and lower current for ionizing the gas between the electrode and lead frame finger surface and thereafter a train of pulses of relatively lower voltage and higher current for delivering energy to the lead frame finger for forming the molten pool.

17. The method of claim 15 wherein the first pulse train is approximately in the range of 4 kV–10 kV and wherein the second pulse train is approximately in the range of 600–750 volts at a frequency in the range of 0–1.5 kHz.

18. The method of claim 13 wherein the step of melting a portion of the surface comprises forming a molten pool to a depth no greater than substantially one third the thickness of said lead frame finger at the location of the molten pool.

19. The method of claim 13 wherein the step of melting a portion of the surface comprises forming a molten pool having a width no greater than substantially one half the width of the lead frame finger.

20. The method of claim 13 wherein the lead frame finger has a width of approximately 10 mils and wherein the molten pool is formed with a width on the surface of the lead frame finger of approximately 3 to 6 mils.

21. The method of claim 13 wherein said lead frame finger comprises an outer layer of stainless steel and wherein the molten pool is formed in the stainless steel layer.

22. The method of claim 18 wherein the lead frame finger comprises an outer layer of stainless steel formed over an inner core of copper alloy and wherein the molten pool is restricted to the stainless steel layer.

23. The method of claim 12 further comprising the step of flooding the lead frame finger with an inert gas during the melting and welding steps.

24. A method for bonding lead wire or bonding wire held in the capillary bonding tool of a bonding machine to a metal lead frame finger where one end of the lead wire has already been bonded to a circuit chip mounted on the lead frame comprising:

preheating said metal lead frame finger to a temperature below the melting point of the lead frame finger metal but above the temperature at which damage might occur to the circuit chip while the lead frame finger is substantially isolated from electrical and thermal coupling between the lead frame finger and circuit chip, said preheating achieved by positioning a preheating electrode over the lead frame finger and applying electrical energy to the lead frame finger through the preheating electrode;

retracting the preheating electrode and terminating application of electrical energy to said lead frame finger through the preheating electrode prior to contact of the lead wire with said lead frame finger;

contact bonding a section of the lead wire to the surface of the preheated lead frame finger;

cooling said lead frame finger and bond;

and serving said lead wire adjacent said bond and lead frame finger.

25. The method of claim 24 wherein the step of cooling comprises directing a stream of inert gas on the lead frame finger and bond.

26. The method of claim 24 wherein said contact bonding step comprises thermocompression bonding.

27. The method of claim 24 wherein the step of preheating comprises:

relatively positioning said preheating electrode and lead frame finger at the desired location on the lead frame finger for bonding;

generating an electrical pulse train of controlled duration for delivering a controlled amount of energy;

and discharging said pulses between the preheating electrode and lead frame finger for preheating to a predetermined temperature.

28. The method of claim 27 wherein the duration of the pulse train is varied to vary said predetermined temperature by varying the number of pulses.

29. The method of claim 24 further comprising the step of flooding the lead frame finger with inert gas during the preheating and bonding steps.

30. Apparatus for welding lead wire or bonding wire from a circuit chip mounted on a lead frame to a metal lead frame finger by preheating of the lead frame finger comprising:

inert gas enclosure means including a base and side walls said inert gas enclosure means forming at least a partial housing for said apparatus and defining a welding and bonding zone;

first inert gas delivery means comprising gas distribution means for flooding the space within said enclosure with inert gas;

lead frame strip feeding means for feeding a strip of lead frames through said enclosure means;

electrode means and electrode mounting means for positioning said electrode means over a selected lead frame and lead frame finger;

capillary wire holding tool mounting means for mounting a capillary wire holding tool in said enclosure over a selected lead frame;

second inert gas delivery means for delivering a directed stream of inert gas for cooling and purging in the vicinity of the selected lead frame and lead frame finger;

circuit means comprising said electrode means and selected lead frame finger;

and pulse generator means for generating an electrical pulse train of controlled duration, said generator means coupled to said circuit means for discharging of said pulses between the electrode means and lead frame finger means for delivering a controlled amount of energy to the lead frame finger to achieve a desired temperature.

31. The apparatus of claim 30 wherein said pulse generator means comprises first pulsed power supply means for generating first pulse means comprising at least one pulse of relatively high voltage and low current to effect ionization of gas between the electrode means and lead frame finger, and second pulsed power supply means for generating a second pulse train of controlled duration, said second pulse train comprising pulses of relatively lower voltage and higher current for delivering a controlled amount of energy to the lead frame finger.

32. The apparatus of claim 31 wherein the first pulsed power supply means is operatively arranged to deliver at least one pulse in the voltage range of approximately 4 kV to 10 kV while said second pulsed power supply means is operatively arranged to deliver pulses in the voltage range of approximately 600 V to 750 V.

33. The apparatus of claim 31 wherein said first and second pulsed power supply means are constructed and arranged to deliver pulses in the frequency range of approximately 0–1.5 kHz.

34. The apparatus of claim 31 further comprising logic gate means operatively coupled between the first and second pulsed power supply means for turning on the second pulse power supply means upon completion of at least one pulse of the first pulse means.

35. The apparatus of claim 31 further comprising logic gate means operatively coupled between the first and second pulsed power supply means for turning on the second pulsed power supply means upon establishment of an ionized current path by the first pulsed power supply means.

36. The apparatus of claim 31 wherein said second pulsed power supply means comprises counter means and means for presetting said counter means for delivering a preset count of electrical pulses.

37. The apparatus of claim 30 wherein said pulse generator means comprises counter means and means for presetting said counter means for delivering a preset count of electrical pulses.

38. The apparatus of claim 30 wherein said pulse generator means comprises gate means for generating a gating signal of controlled duration for controlling the duration of the pulse train.

* * * * *

UNITED STATES PATENT AND TRADEMARK OFFICE
CERTIFICATE OF CORRECTION

PATENT NO. : 4,434,347
DATED : February 28, 1984
INVENTOR(S) : John A. Kurtz, et al It is certified that error appears in the above-identified patent and that said Letters Patent is hereby corrected as shown below:

Column 15, line 40, Claim 1, "welding" should read --weld--.
Column 16, line 7, Claim 1, "serving" should read --severing--.
Column 17, line 25, Claim 12, "serving" should read --severing--.

Column 18, line 42, Claim 24, "serving" should read --severing--.

Signed and Sealed this

Fifth Day of March 1985

[SEAL]

Attest:

DONALD J. QUIGG

*Attesting Officer*     *Acting Commissioner of Patents and Trademarks*